United States Patent
Kim et al.

(10) Patent No.: US 11,624,027 B2
(45) Date of Patent: Apr. 11, 2023

(54) QUANTUM DOTS AND DEVICES INCLUDING THE SAME

(71) Applicant: SAMSUNG ELECTRONICS CO., LTD., Suwon-si (KR)

(72) Inventors: Sung Woo Kim, Hwaseong-si (KR); Eun Joo Jang, Suwon-si (KR); Hyo Sook Jang, Suwon-si (KR); Hwea Yoon Kim, Suwon-si (KR); Yuho Won, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 26 days.

(21) Appl. No.: 17/366,429

(22) Filed: Jul. 2, 2021

(65) Prior Publication Data

US 2022/0002621 A1    Jan. 6, 2022

(30) Foreign Application Priority Data

Jul. 3, 2020 (KR) .................. 10-2020-0082320

(51) Int. Cl.
| | |
|---|---|
| *C09K 11/88* | (2006.01) |
| *C09K 11/56* | (2006.01) |
| *C01B 19/00* | (2006.01) |
| *C01G 9/08* | (2006.01) |
| *C09K 11/62* | (2006.01) |
| *B82Y 20/00* | (2011.01) |
| *H01L 51/50* | (2006.01) |
| *B82Y 40/00* | (2011.01) |

(52) U.S. Cl.
CPC .......... *C09K 11/883* (2013.01); *C01B 19/007* (2013.01); *C01G 9/08* (2013.01); *C09K 11/56* (2013.01); *C09K 11/62* (2013.01); *B82Y 20/00* (2013.01); *B82Y 40/00* (2013.01); *C01P 2004/04* (2013.01); *C01P 2004/64* (2013.01); *C01P 2006/60* (2013.01); *C09K 2211/10* (2013.01); *H01L 51/502* (2013.01)

(58) Field of Classification Search
CPC ...... C09K 11/883; H01L 51/502; B82Y 40/00
See application file for complete search history.

(56) References Cited

U.S. PATENT DOCUMENTS

| | | | |
|---|---|---|---|
| 8,153,022 B2 | 4/2012 | Ryowa | |
| 2011/0084250 A1* | 4/2011 | Jang | H05B 33/14 257/14 |
| 2016/0167965 A1 | 6/2016 | Jang et al. | |
| 2019/0023571 A1 | 1/2019 | Jang et al. | |
| 2019/0276737 A1 | 9/2019 | Won et al. | |
| 2019/0276738 A1 | 9/2019 | Kim et al. | |
| 2020/0263083 A1* | 8/2020 | Kim | C09K 11/025 |
| 2021/0207027 A1 | 7/2021 | Won et al. | |

FOREIGN PATENT DOCUMENTS

| | | | |
|---|---|---|---|
| EP | 3536761 A1 | 9/2019 | |
| EP | 3536762 A1 | 9/2019 | |
| KR | 101711085 B1 | 3/2017 | |
| WO | 2013114308 A1 | 8/2013 | |
| WO | WO 2013/114308 | * 8/2013 | |
| WO | 2015020349 A1 | 2/2015 | |

OTHER PUBLICATIONS

Aqiang Wang et al., "Bright, efficient, and color-stable violet ZnSe-based quantum dot light-emitting diodes," Nanoscale, Jan. 5, 2015, pp. 2951-2959, vol. 7.
Eun-Pyo Jang et al., "Synthesis of Alloyed ZnSeTe Quantum Dots as Bright, Color-Pure Blue Emitters,"ACS Applied Materials & Interfaces, Nov. 20, 2019, pp. 46062-46069, vol. 11.
Extended European Search Report dated Dec. 1, 2021, of the corresponding European Patent Application No. 21183511.1.

* cited by examiner

*Primary Examiner* — C Melissa Koslow
(74) *Attorney, Agent, or Firm* — Cantor Colburn LLP

(57) ABSTRACT

A quantum dot according to an embodiment includes a core including a first semiconductor nanocrystal including zinc, selenium, and tellurium and a semiconductor nanocrystal shell on the core, the semiconductor nanocrystal shell including a zinc chalcogenide, wherein the quantum dot does not include cadmium, the zinc chalcogenide includes zinc and selenium, the quantum dot further includes gallium and a primary amine having 5 or more carbon atoms, and the quantum dot is configured to emit light having a maximum emission peak in a range of greater than about 450 nanometers (nm) and less than or equal to about 480 nm by excitation light. A method of producing the quantum dot and an electronic device including the same are also disclosed.

23 Claims, 8 Drawing Sheets

QUANTUM DOTS AND DEVICES INCLUDING THE SAME

CROSS-REFERENCE TO RELATED APPLICATION

This application claims priority to and the benefit of Korean Patent Application No. 10-2020-0082320 filed in the Korean Intellectual Property Office on Jul. 3, 2020, and all the benefits accruing therefrom under 35 U.S.C. § 119, the content of which in its entirety is herein incorporated by reference.

BACKGROUND

1. Field

Quantum dots and devices including the same are disclosed.

2. Description of the Related Art

Physical characteristics (e.g., bandgap energies and melting points) of nanoparticles that are intrinsic characteristics may be controlled by changing particle sizes of the nanoparticles, unlike bulk materials. For example, semiconductor nanocrystal particles that are also referred to as quantum dots are a crystalline material having a size of several nanometers. Such semiconductor nanocrystal particles have such a small size that they have a large surface area per unit volume and exhibit quantum confinement effects, and thus have different properties from the characteristics of bulk materials having the same composition. Quantum dots may absorb light from an excitation source to be excited, and may emit energy corresponding to bandgap energies of the quantum dots.

Quantum dots may be synthesized using a vapor deposition method of metal organic chemical vapor deposition (MOCVD), molecular beam epitaxy (MBE), and the like, a wet chemical method of adding precursor materials to an organic solvent to grow crystals, and the like. In the wet chemical method, organic compounds such as ligands/coordinating solvents may be coordinated on, e.g., bound to, surfaces of nanocrystals to control crystal growth.

SUMMARY

An embodiment provides a blue light emitting cadmium-free semiconductor nanocrystal particles having improved optical properties.

An embodiment provides a method of producing the aforementioned semiconductor nanocrystal particles.

An embodiment provides an electronic device including the aforementioned semiconductor nanocrystal particles.

In an embodiment, a quantum dot includes a core including a first semiconductor nanocrystal including zinc, selenium, and tellurium, and a semiconductor nanocrystal shell on the core, the semiconductor nanocrystal shell including a zinc chalcogenide, the quantum dots do not include cadmium, the zinc chalcogenide includes zinc and selenium, the quantum dot further includes gallium and a primary amine having 5 or more carbon atoms, and the quantum dot is configured to emit light having a maximum emission peak in a range of greater than about 450 nanometers (nm) and less than or equal to about 480 nm by excitation light.

The maximum emission peak may have a full width at half maximum (FWHM) of less than about 33 nm, for example, less than or equal to about 32 nm, or less than or equal to about 31 nm.

The maximum emission peak of the quantum dot may exist in a range of greater than or equal to about 453 nm.

The first semiconductor nanocrystal or the quantum dot may not include a Group III-V compound.

In the quantum dot, a mole ratio of tellurium to selenium may be greater than or equal to about 0.0053:1.

In the quantum dot, a mole ratio of gallium to zinc may be greater than or equal to about 0.1:1.

The zinc chalcogenide may further include sulfur, and a mole ratio of selenium to zinc in the quantum dot may be greater than or equal to about 0.46:1, and a mole ratio of sulfur to selenium may be less than or equal to about 0.93:1.

The quantum dot may have an average extinction time for the excitation light of less than or equal to about 50 nanoseconds (ns), or less than or equal to about 49 ns, as determined by a time-resolved photoluminescence analysis.

The quantum dot may have a tellurium (Te) relative emission of less than or equal to about 50%, as determined by a time-resolved photoluminescence analysis.

In a gas chromatography mass spectrometry, the quantum dot may exhibit a peak of a primary carboxylic acid compound having 10 or more carbon atoms and a peak of the primary amine, and a peak intensity ratio of the peak of the primary amine to the peak of the primary carboxylic acid compound may be greater than or equal to about 0.5:1.

The peak intensity ratio of the peak of the primary amine to the peak of the primary carboxylic acid compound may be greater than or equal to about 1:1.

The quantum dot may have quantum efficiency of greater than or equal to about 75%.

The quantum dot may have a 5% weight loss temperature of less than about 400° C., as determined by a thermogravimetric analysis.

The quantum dot may have an organic material content of less than or equal to about 12 weight percent, as determined by a thermogravimetric analysis.

The quantum dot may have a ratio of a luminance intensity at 500 nm to the intensity at the maximum emission peak wavelength of less than or equal to about 0.1:1.

In an embodiment, a method of producing a quantum dot includes adding (e.g., dispersing) a quantum dot including a core including a first semiconductor nanocrystal including zinc, selenium, and tellurium and a semiconductor nanocrystal shell on the core, the semiconductor nanocrystal shell including a zinc chalcogenide in an organic solvent to prepare a mixture (e.g., a dispersion or a solution); and adding a gallium treatment agent including a gallium compound and a primary amine, and optionally a sulfur treatment agent, to the mixture (e.g., the dispersion or the solution), and heating the mixture to a temperature of greater than or equal to about 180° C.

The gallium compound may include alkylated gallium.

The gallium treatment agent may not include oxygen.

The sulfur treatment agent may include a bis(substituted or unsubstituted alkyl) sulfide compound (e.g., a bis(trialkylsilylalkyl) sulfide compound).

In an embodiment, the quantum dot includes zinc, selenium, tellurium, and sulfur and do not include cadmium, the quantum dot further includes gallium and a primary amine having 5 or more carbon atoms, the quantum dot is configured to emit light having a maximum emission peak in a range of greater than or equal to about 453 nm and less than or equal to about 480 nm by excitation light, and in the quantum dot, a mole ratio of gallium to zinc is greater than or equal to about 0.1:1 and less than about 1:1.

The gallium and the amine may be bound to the surface of the quantum dot.

The quantum dot may have a full width at half maximum (FWHM) of less than or equal to about 30 nm.

The quantum dot may have a quantum efficiency of greater than or equal to 80%.

The primary amine may include an alkenyl group having 10 or more carbon atoms.

The quantum dot may not include a semiconductor nanocrystal of a Group III-V compound.

In an embodiment, an electroluminescent device includes a first electrode and a second electrode facing each other; and a quantum dot emission layer between the first electrode and the second electrode, the quantum dot emission layer including a plurality of quantum dots, wherein the plurality of quantum dots may include the aforementioned quantum dots.

A charge auxiliary layer may be included between the first electrode and the quantum dot emission layer, between the second electrode and the quantum dot emission layer, or between the first electrode and the quantum dot emission layer and between the second electrode and the quantum dot emission layer.

The charge auxiliary layer may include a charge transport layer, a charge injection layer, or a combination thereof.

The electroluminescent device may have a peak external quantum efficiency of greater than or equal to about 4%, greater than or equal to about 4.5%, or greater than or equal to about 5%.

The electroluminescent device may have a maximum luminance of greater than or equal to about 20,000 candelas per square meter ($cd/m^2$).

In an embodiment, a quantum dot includes a core including a first semiconductor nanocrystal comprising zinc, selenium, and tellurium; a semiconductor nanocrystal shell on the core, the semiconductor nanocrystal shell including zinc and selenium; and a ligand including gallium and a primary amine having 5 or more carbon atoms on a surface of the quantum dot, wherein the quantum dot does not including cadmium, the quantum dot is configured to emit light having a maximum emission peak in a range of greater than about 450 nanometers and less than or equal to about 480 nanometers by excitation light, and the maximum emission peak has a full width at half maximum of less than about 33 nanometers.

In an embodiment, the electronic device includes the aforementioned semiconductor nanocrystal particles.

The electronic device may include (or may be) a display device, a light emitting diode (LED), a quantum dot light emitting diode (QLED), an organic light emitting diode (OLED), a sensor, an imaging sensor, or a solar cell device.

A cadmium-free quantum dot capable of emitting light in a blue region with improved luminous efficiency, a relatively narrow full width at half maximum (FWHM), and reduced tail emission may be provided. The quantum dot of an embodiment may exhibit a further reduced decay time in time-resolved photoluminescence analysis. The quantum dot of an embodiment may be applied to, e.g., used in, various display devices and biological labeling (biosensors, bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
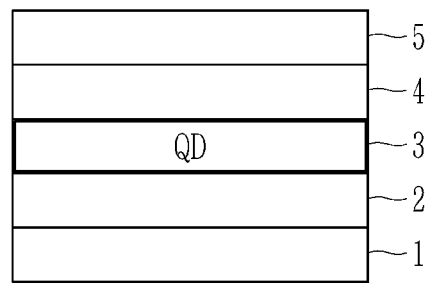
FIG. 1 is a schematic cross-sectional view of a quantum dot (QD) LED device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. Unless otherwise defined, all terms used in the specification (including technical and scientific terms) may be used with meanings commonly understood by a person having ordinary knowledge in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety in which at least one hydrogen atoms thereof is replaced by a substituent of a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—O(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hydrocarbon" or a "hydrocarbon group" refers to a group including carbon and hydrogen (e.g., alkyl, alkenyl, alkynyl, or aryl group). The hydrocarbon group may be a group having a monovalence or more formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

As used herein, when a definition is not otherwise provided, "alkyl" refers to a linear or branched saturated monovalent hydrocarbon group (methyl, ethyl hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aryl" refers to a group formed by removal of at least one hydrogen from an aromatic group (e.g., a phenyl or naphthyl group).

As used herein, when a definition is not otherwise provided, "hetero" refers to one including 1 to 3 heteroatoms of N, O, S, Si, P, or a combination thereof.

As used herein, when a definition is not otherwise provided, "Group" refers to a group of Periodic Table.

As used herein, when a definition is not otherwise provided, the phrase "do not include cadmium (or hazardous heavy metal)" or variants thereof refers to a concentration of cadmium (or corresponding hazardous heavy metal) that is less than or equal to about 100 parts per million by weight (ppmw), less than or equal to about 50 ppmw, less than or equal to about 10 ppmw, or about 0 ppmw. In an embodiment, the quantum dots include substantially no cadmium, or even in a case of the presence of cadmium, the content of cadmium (or hazardous heavy metal) may be less than or equal to the detectable limit by the provided analyzing means (e.g., inductively coupled plasma atomic emission spectroscopy, etc.) or a level of impurity.

In an embodiment, "quantum yield" or "quantum efficiency" may be a ratio of photons emitted to photons absorbed, e.g., by a nanostructure (a quantum dot) or population of nanostructures (quantum dots). A quantum efficiency or a quantum yield may be measured, for example, in a solution state or a solid state (e.g., in a composite). In an embodiment, the quantum efficiency may be determined by any method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on their PL wavelengths, but are not limited thereto.

The QY may be readily and reproducibly determined by using commercially available equipment (spectrophotometer), for example, from Hitachi Co. Ltd or Hamamatsu Co. Ltd and referring to the instruction manuals provided from the manufacturer.

A full width at half maximum of the quantum dot(s) can be readily or reproducibly measured a photoluminescent spectrum obtained by any commercially available equipment (spectrophotometer) for example, from Hitachi Co. Ltd or Hamamatsu Co. Ltd.

The quantum efficiency or the FWHM may be measured at room temperature (e.g., at a temperature of 20-30° C.).

A core-shell structure may improve luminescence properties of quantum dots, but core-shell quantum dots having desirable properties may be cadmium-based materials. Thus desired is development of cadmium-free semiconductor nanocrystal particles capable of exhibiting desired luminescence properties.

Semiconductor nanocrystal particles (hereinafter, also referred to as quantum dots) may absorb light from an excitation source and may emit energy corresponding to bandgap energies of the quantum dots. Bandgap energies of quantum dots may be changed according to sizes and compositions of the quantum dots. For example, as the sizes of quantum dots increase, the quantum dots may have narrow bandgap energies and increased emission wavelengths. Semiconductor nanocrystals have drawn attention as light emitting materials in various fields of a display device, an energy device, or a bio light emitting device.

Quantum dots having luminescence properties at an applicable level may be based on cadmium (Cd). Cadmium may cause severe environment/health problems and is a restricted element by Restriction of Hazardous Substances Directive (RoHS) in a plurality of countries. Accordingly, there are needs for development of a cadmium-free quantum dot having improved luminescence characteristics. Quantum dots based on zinc selenide have a short emission wavelength, and implementing, e.g., providing, a device emitting a real, e.g., pure, blue by emitting purple or deep blue may be difficult. In order to be applied to, e.g., used in, a QLED display device, a pure blue quantum dot capable of emitting light of pure blue (e.g., PL peak around 455 nm) is desired. For example, a blue light emitting material is desired to be applied to, e.g., used in, a display device having a relatively high (e.g., about 90% or greater) color reproducibility based on the next generation color standard BT2020.

In quantum dot(s) according to an embodiment, the component elements are linked by a relatively strong ionic bond while not based on cadmium, and having a structure and a composition which are described herein, and pure blue light with improved optical properties may be emitted. In an embodiment, the quantum dots may not include hazardous heavy metal (e.g., cadmium, lead, mercury, or a combination thereof), which is environmentally-friendly.

The quantum dot(s) include a core including a first semiconductor nanocrystal including zinc, selenium, and tellurium, and a semiconductor nanocrystal shell disposed on the core (at least a portion of) and including a zinc chalcogenide. The semiconductor nanocrystal shell may be a second semiconductor nanocrystal having a composition different from that of the first semiconductor nanocrystal. The second semiconductor nanocrystal or the zinc chalcogenide may include zinc; and selenium, sulfur, or a combination thereof. The quantum dot may further include gallium and a primary amine having 5 or more carbon atoms. The quantum dot is configured to emit light (blue light) having a maximum emission peak by excitation (e.g., excited by light or photoexcitation) in the range of greater than about 450 nm (e.g., greater than or equal to about 453 nm) and less than or equal to about 480 nm (less than or equal to about 475 nm, or less than or equal to about 470 nm or less than or equal to about 459 nm). In an embodiment, the first semiconductor nanocrystal or the quantum dot may not include a Group III-V compound (e.g., InP, InZnP, InAs, InN, GaN, InGaP, or a combination thereof).

The first semiconductor nanocrystal material of the core may include a limited amount of tellurium (Te). The core may include $ZnTe_cSe_{1-x}$ (wherein, x is greater than about 0 and less than or equal to about 0.05). In the core, the wavelength of the maximum emission peak of the semiconductor nanocrystal particle may be increased by increasing a mole ratio of tellurium to a content of selenium. In the core, the amount of tellurium may be greater than or equal to about 0.002 moles, greater than or equal to about 0.003 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, greater than or equal to about 0.03 moles, greater than or equal to about 0.04 s, greater than or equal to about 0.05 moles, or greater than or equal to about 0.06 moles, relative to 1 mole of selenium. In the core, the amount of tellurium may be less than or equal to about 0.1 moles, less than or equal to about 0.09 moles, less than or equal to about 0.08 moles, or less than or equal to about 0.07 moles, relative to 1 mole of selenium. In an embodiment, the core or quantum dots may not include manganese, copper, or a combination thereof.

The semiconductor nanocrystal shell includes a zinc chalcogenide. The zinc chalcogenide or the semiconductor nanocrystal shell includes zinc; and selenium, sulfur, or a combination thereof.

The shell may be a multi-layered shell including a plurality of layers. Adjacent layers of the plurality of layers may include semiconductor materials having different compositions from each other. The multi-layered shell may include a first layer disposed directly on the core and a second layer disposed on the first layer. The first layer may include the second semiconductor nanocrystal. The second layer may include a third semiconductor nanocrystal having a composition different from that of the second semiconductor nanocrystal. The second layer may be an outermost layer of quantum dots. The second semiconductor nanocrystal may include zinc, selenium, and optionally sulfur. The third semiconductor nanocrystal may include zinc and sulfur. in an embodiment, the third semiconductor nanocrystal may not include selenium.

In the shell or multi-layered shell, each layer may be a gradient alloy having a composition that changes in a radial direction. In an embodiment, a content of sulfur in the semiconductor nanocrystal shell may increase toward the surface of the quantum dot. For example, in the shell, the amount of sulfur may have a concentration gradient that increases in a direction away from the core.

The quantum dot has a mole ratio (Te:Se) of tellurium to the selenium (for example, as measured by inductively coupled plasma atomic emission spectroscopy (ICP-AES)) of less than or equal to about 0.05:1, less than or equal to about 0.04:1, less than or equal to about 0.03:1, less than or equal to about 0.02:1, less than or equal to about 0.015:1, or less than or equal to about 0.01:1. The mole ratio of the tellurium to the selenium may be greater than or equal to about 0.001:1, for example, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004:1, greater than or equal to about 0.0045:1, greater than or equal to about 0.005:1, greater than or equal to about 0.0055:1, greater than or equal to about 0.006:1, greater than or equal to about 0.0065:1, greater than or equal to about 0.007:1, greater than or equal to about 0.0075:1, or greater than or equal to about 0.008:1. The mole ratio of the tellurium to the selenium may be about 0.004:1 to about 0.03:1. The mole ratio of the tellurium to the selenium may be about 0.005:1 to about 0.02:1. The mole ratio of the tellurium to the selenium may be about 0.006:1 to about 0.01:1.

In the quantum dot, a mole ratio of the tellurium to the zinc (Te:Zn) (e.g., as determined by inductively coupled plasma atomic emission spectroscopy) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, less than or equal to about 0.009:1, less than or equal to about 0.008:1, less than or equal to about 0.007:1, less than or equal to about 0.006:1, or less than or equal to about 0.005:1. The mole ratio of the tellurium to the zinc may be greater than or equal to about 0.001:1, for example greater than or equal to about 0.0015:1, greater than or equal to about 0.002:1, greater than or equal to about 0.0025:1, greater than or equal to about 0.003:1, or greater than or equal to about 0.035:1.

In the quantum dot, a content of the zinc may be greater than a content of the selenium. The amount of zinc (Zn) may be greater than that of selenium (Se), and the amount of selenium may be greater than that of tellurium, for example, as confirmed by ICP-AES analysis of the quantum dot.

For example, in ICP-AES analysis, a mole ratio of Se to Zn may be less than about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, less than or equal to about 0.48:1, or less than or equal to about 0.45:1 (e.g., in ICP-AES analysis), and the mole ratio of Se to Zn may be greater than or equal to about 0.1:1, greater than or equal to about 0.2:1, greater than or equal to about 0.3:1, greater than or equal to about 0.4:1, greater than or equal to about 0.45:1, or greater than or equal to about 0.46:1.

In the quantum dot, a mole ratio of sulfur to Zn may be greater than or equal to about 0.1:1, for example, greater than or equal to about 0.15:1, greater than or equal to about 0.2:1, greater than or equal to about 0.3:1, greater than or equal to about 0.35:1, greater than or equal to about 0.39:1, or greater than or equal to about 0.4:1. In the quantum dot, the mole ratio of sulfur to Zn may be less than or equal to about 0.9:1, less than or equal to about 0.8:1, less than or equal to about 0.7:1, less than or equal to about 0.6:1, less than or equal to about 0.5:1, less than or equal to about 0.45:1, or less than or equal to about 0.43:1.

The quantum dot may include selenium and sulfur, and a mole ratio of Se+S to zinc in the quantum dot may be greater than or equal to about 0.3:1, greater than or equal to about 0.4:1, greater than or equal to about 0.5:1, greater than or equal to about 0.6:1, greater than or equal to about 0.7:1, greater than or equal to about 0.8:1, greater than or equal to about 0.85:1, or greater than or equal to about 0.89:1. In the quantum dot, the mole ratio of Se+S to zinc may be less than or equal to about 1:1.

The quantum dot may include selenium and sulfur, and a mole ratio of sulfur to selenium (S/Se) in the quantum dot may be less than or equal to about 2:1, less than or equal to about 1.95:1, less than or equal to about 0.93:1, less than or equal to about 1.9:1, less than or equal to about 1.85:1, less than or equal to about 1.80:1, less than or equal to about 1.40:1, less than or equal to about 1.25:1, less than or equal to about 1.15:1, less than or equal to about 1.1:1, less than or equal to about 1:1, less than or equal to about 0.95:1, or less than or equal to about 0.92:1. In an embodiment, the quantum dot may have a mole ratio of sulfur to selenium of greater than or equal to about 0.4:1, greater than or equal to about 0.5:1, greater than or equal to about 0.6:1, greater than or equal to about 0.7:1, greater than or equal to about 0.75:1, greater than or equal to about 0.8:1, or greater than or equal to about 0.82:1, or greater than or equal to about 0.84:1.

Without being bound by any particular theory, it is understood that when the quantum dots having the composition according to an embodiment include tellurium in the aforementioned amount, the tellurium may contribute to the final quantum dots emitting light having a desired wavelength (e.g., greater than or equal to about 450 nm). To accomplish, e.g., provide, a device emitting a real, e.g., pure, blue, the demand for blue color having a wavelength shifting toward a long wavelength is increasing, and increasing Te content may be desired. However, without being bound by any particular theory, it is understood that the increasing Te content may cause an increase in a full width at half maximum (FWHM), for example, causing an increase in a tail emission (e.g., emitting light of emission wavelength of greater than or equal to about 500 nm) in quantum dots emitting blue light, and may tend to deteriorate a surface passivation quality due to oxidation of tellurium present on a surface of a particle. The problems may have an unfavorable influence on a color reproducibility of a device including quantum dots.

Quantum dots according to an embodiment may further include gallium and a primary amine having 5 or more carbon atoms, and quantum dots according to an embodiment may solve the aforementioned technical problems while emitting light (blue light) having a maximum emission peak in a range of greater than about 450 nm and less than or equal to about 480 nm by excitation (or photoexcitation).

Without being bound by any particular theory, as ZnSe or ZnSeTe-based quantum dots may include a ligand of oleic acid or metal-oleate on the surface thereof, the increasing tellurium amount may have an unfavorable influence on the surface passivation or the optical properties of final quantum dots, for example, by vulnerability on tellurium oxidation and the like. Quantum dots according to an embodiment may be obtained through a surface exchange reaction performed together with exchange of cation and ligand, thereby, for example, as disclosed herein, a gallium-(primary) amine ligand or a gallium-sulfur-(primary) amine ligand may be disposed as well as a ligand of oleic acid or metal oleate on the surface, and improved passivation may be provided. Accordingly, in the final quantum dots, the frequencies of Zn dangling bond or chalcogen (e.g., S) dangling bond may be decreased, and the hole trap in quantum dots may be decreased even in the presence of a relatively increased amount of Te, and in a range of greater than or equal to about 500 nm, the trap emission may be significantly decreased, and the final quantum dots may have a decreased level of full width at half maximum (FWHM) together with a high quantum efficiency.

In the quantum dot, a mole ratio of gallium to zinc may be greater than or equal to about 0.1:1, greater than or equal to about 0.13:1, greater than or equal to about 0.15:1, greater than or equal to about 0.17:1, greater than or equal to about 0.19:1, or greater than or equal to about 0.2:1. In the quantum dot, the mole ratio of gallium to zinc may be less than about 1:1, less than or equal to about 0.9:1, less than or equal to about 0.85:1, less than or equal to about 0.8:1, less than or equal to about 0.75:1, or less than or equal to about 0.7:1.

The primary amine may have a substituted or unsubstituted aliphatic or aromatic hydrocarbon group having 10 or more, 15 or more, or 20 or more carbon atoms. The primary amine may include a monoamine. The primary amine may include oleyl amine, stearyl amine, or lauryl amine, or a combination thereof.

The quantum dot may include an amine-gallium-containing ligand, a sulfur-gallium-amine-containing ligand, or a combination thereof on a surface thereof. The quantum dot may exhibit, e.g., include, a gallium-sulfur bond, for example, as confirmed by XPS or the like. The quantum dots may exhibit, e.g., include, a gallium-nitrogen bond, for example, as confirmed by XPS or the like.

The quantum dot may further include an organic ligand (e.g., on its surface). The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$ (wherein, R and R' are independently a C1 to C40 (or a C3 to C20) substituted or unsubstituted aliphatic hydrocarbon, or a C6 to C40 (or a C6 to C20) substituted or unsubstituted aromatic hydrocarbon, or a combination thereof), or a combination thereof. The ligand may be used alone or in a mixture of two or more ligands.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methane amine, ethane amine, propane amine, butane amine, pentane amine, hexane amine, octane amine, dodecane amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine compound or an oxide compound thereof such as methyl phosphine oxide, ethyl phosphine oxide, propyl phosphine oxide, butyl phosphine oxide, or trioctylphosphine oxide; a diphenyl phosphine or triphenyl phosphine compound, or an oxide compound thereof; phosphonic acid, and the like, but are not limited thereto. The organic ligand compound may be used alone or in a mixture of two or more compounds. In an embodiment, the organic ligand compound may be a combination of RCOOH and amine (e.g., $RNH_2$, $R_2NH$, $R_3N$, or a combination thereof).

The quantum dot may exhibit a peak of a primary carboxylic acid compound having 10 or more carbon atoms and a peak of the primary amine in gas chromatography mass spectrometry, and a peak intensity ratio of the peak of the primary amine to the peak of the primary carboxylic acid compound may be greater than or equal to about 0.5:1, greater than or equal to 1:1, or greater than or equal to 1.5:1. The peak intensity ratio of the peak of the primary amine to the peak of the primary carboxylic acid compound may be greater than or equal to about 1:1. The peak intensity ratio of the peak of the primary amine to the peak of the primary carboxylic acid compound may be less than or equal to about 10:1, less than or equal to about 5:1, or less than or equal to about 3:1.

The quantum dot may have a 5% weight loss temperature of less than 400° C., less than or equal to about 390° C., or less than or equal to about 380° C., as determined by a thermogravimetric analysis. The quantum dot may have an organic material content of less than or equal to about 12 weight percent (wt %), for example, as confirmed by a thermogravimetric analysis. In an embodiment, the quantum dot may have an organic material content of greater than or equal to about 12 wt % and less than or equal to about 15 wt %, for example, as confirmed by a thermogravimetric analysis.

The quantum dot of an embodiment may have improved quantum efficiency (e.g., of greater than or equal to about 70%, greater than or equal to about 71%, greater than or equal to about 72%, greater than or equal to about 73%, greater than or equal to about 74%, greater than or equal to about 75%, greater than or equal to about 76%, greater than or equal to about 77%, greater than or equal to about 78%, greater than or equal to about 79%, or greater than or equal to about 80%) and a decreased full width at half maximum (FWHM) (e.g., less than or equal to about 33 nm, less than about 33 nm, less than or equal to about 32 nm, less than or equal to about 31 nm, less than or equal to about 30 nm, less than or equal to about 25 nm, less than about 25 nm, or less than or equal to about 22 nm) and may emit blue light (e.g., having a relatively long wavelength of greater than or equal to about 453 nm).

The quantum dot may have any suitable shape. For example, the quantum dot may have a spherical shape, a polyhedron shape, a multipod, or a combination thereof.

An average size of the core may be greater than or equal to about 2 nm, greater than or equal to about 3 nm, or greater than or equal to about 4 nm. The average size of the core may be less than or equal to about 6 nm, for example less than or equal to about 5 nm. The quantum dot may have a relatively large size while emitting blue light, and thus have improved stability and may be easy to handle. For example, the quantum dot may have a size of greater than or equal to about 10 nm, for example greater than or equal to about 11 nm, or even greater than or equal to about 12 nm. Herein, the size of the quantum dot may be a diameter (or a diameter calculated by assuming a sphere from an electron microscope two-dimensional image of the quantum dot if the quantum dot is not a sphere). A size of the semiconductor nanocrystal may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm.

The quantum dot may have a relatively controlled shape. The quantum dot(s) may have a solidity of greater than or equal to about 0.9, for example, 0.91, greater than or equal to about 0.92, or greater than or equal to about 0.93, and greater than or equal to about 0.99, and less than or equal to about 0.98, or less than or equal to about 0.97 in an electron microscopy analysis using a commercially available image analysis program.

As used herein, the term "solidity" refers to a ratio of an area (B) of a two dimensional area of a quantum dot with respect to an area (A) of a convex hull. The convex hull may be defined as the smallest convex set of points in which a set of all points constituting a two dimensional image of a given quantum dot obtained by an electron microscopic analysis is contained. Stated otherwise, the convex hull may be defined as a convex polygon of the smallest area in which a set of all points constituting a two dimensional image of a given quantum dot obtained by an electron microscopic analysis is contained. The solidity may be measured by a transmission electron microscopic analysis. For example, a commercially-available computer program (e.g., an image processing program such as "image J") may be used to calculate (an average value of) solidity from a transmission electron microscopy (TEM) image of the quantum dots.

The quantum dot(s) may have a roundness of greater than or equal to about 0.8, greater than or equal to about 0.82 and less than or equal to about 0.95, or less than or equal to about 0.9 in an electron microscopy analysis using a commercially available image analysis program (e.g., Image J).

As used herein, the term "roundness" refers to a definition as provided in The ImageJ User Guide (v 1.46r) and may be defined as follows:

$$4 \times ((Area)/(\pi \times (major\ axis)^2)).$$

The roundness may correspond to a reciprocal number of an aspect ratio. The aspect ratio may be a ratio of a major axis with respect to a minor axis. The "Area" may be a two-dimensional image area of a given particle and the major axis may refer to a main axis of the best-fitted oval shape of a given image. The roundness may reflect a ratio between an inscribed circle and a circumscribed circle for a given object.

The quantum dot(s) may have a circularity of greater than or equal to about 0.7, greater than or equal to about 0.72 and less than or equal to about 0.95, less than or equal to about 0.9, or less than or equal to about 0.8, in an electron microscopy analysis using a commercially available image analysis program.

As used herein, the "circularity" may be determined by using a two dimensional image obtained by an electron microscopy analysis and using the following equation referring to image J user guide (v 1.46r):

$$4\pi \times ((Area)/(Perimeter)^2))$$

The circularity may be 1 for a perfect circle and as the circularity is closer to zero (0), a given shape is an increasingly elongated shape.

The quantum dot may exhibit a significantly reduced level of tail emission while emitting pure blue light. Therefore, in the photoluminescence analysis of the quantum dot, a ratio of a luminance intensity at 500 nm to the intensity at the maximum emission peak wavelength may be less than or equal to about 0.1:1, less than or equal to about 0.095:1, less than or equal to about 0.09:1, less than or equal to about 0.085:1, less than or equal to about 0.08:1, less than or equal to about 0.075:1, or less than or equal to about 0.07:1.

In an embodiment, a semiconductor nanocrystal particle includes zinc, selenium, tellurium, and sulfur, and does not include cadmium, the semiconductor nanocrystal particle further includes gallium and a primary amine having 5 or more carbon atoms, the semiconductor nanocrystal particle(s) (hereinafter, referred to as a semiconductor nanocrystal particle) is configured to emit light having a maximum emission peak in a range of greater than or equal to about 453 nm and less than or equal to about 480 nm by excitation light, and in the semiconductor nanocrystal particle, a mole ratio of gallium to zinc is greater than or equal to about 0.1:1 and less than about 1:1. The gallium and the amine may be bound to the surface of the semiconductor nanocrystal particles. The semiconductor nanocrystal particle may have a full width at half maximum (FWHM) of less than or equal to about 30 nm. The semiconductor nanocrystal particle may have a quantum efficiency of greater than or equal to 80%. The primary amine may include an alkenyl group having 10 or more carbon atoms. In an embodiment, the quantum dot may not include a semiconductor nanocrystal of a Group III-V compound. In addition, the descriptions for the aforementioned quantum dot may be applied to the semiconductor nanocrystal particle.

In an embodiment, the time resolved photoluminescence (TRPL) is used to determine a temporal evolution and a corresponding radiative lifetime with respect to an emitted light having a predetermined wavelength. An apparatus for the TRPL analysis is commercially available. The luminescence data may be fit with a multi-exponential decay of the form:

$$I(t) = \sum_{i=1}^{N} a_i e^{-t/\tau_i}$$

convolved with the instrument response function, where t is time, I(t) is an intensity at the time t, $t_i$ and $a_i$ correspond to the lifetime and the fractional contribution of each component to the decay, respectively.

In an embodiment, the quantum dots may be well fit by a four-term exponential decay function composed of a fast initial decay (t1), followed by a moderate decay (t2), in addition to two longer lived components (t3 and t4), and the decay time (or lifetime) at each component is denoted as t1, t2, and t3 & t4, respectively. An average decay or extinction time ($t_{avg}$) is a weighted average of the decay times of the components.

In an embodiment, t1 may be 0-about 10 ns, for example, about 3 ns, t2 may be about 10 to 30 ns, for example, about 21 ns, t3 and t4 may be about 50-100 ns (e.g., about 58 ns), and about 100 ns to 200 ns (e.g., about 169 ns), respectively. In an embodiment, t3 may be an emission portion due to the presence of the tellurium, and a ratio (e.g., fractional contribution) of t3 (or relative emission ratio of tellurium, or tellurium relative emission) may be less than about 59%, less than or equal to about 50%, or less than or equal to about 48%, as determined by a time-resolved photoluminescence analysis.

In an embodiment, the quantum dot(s) may have an average decay time of less than about 65 ns, less than or equal to about 50 nanoseconds (ns), or less than or equal to about 49 ns, as determined by a time-resolved photoluminescence analysis.

The quantum dots (or semiconductor nanocrystal particles) according to an embodiment may be obtained by preparing a mixture (e.g., a solution or a dispersion) in which pristine quantum dots (or pristine semiconductor nanocrystal particles including zinc, selenium, tellurium, and sulfur and not including cadmium) including a core including a first semiconductor nanocrystal including zinc, selenium, and tellurium and a semiconductor nanocrystal shell disposed on the core and including a zinc chalcogenide are mixed, for example, dispersed, in an organic solvent, and treating with a gallium treatment agent and, optionally, a sulfur treatment agent in the mixture (e.g., the solution or the dispersion). The surface passivation state of quantum dots may be changed by the reaction with the treatment agent.

In an embodiment, the pristine quantum dots or the pristine semiconductor nanocrystal may be obtained by providing a core including a first semiconductor nanocrystal including zinc, selenium, and tellurium (hereinafter, also referred to core); and reacting a zinc precursor and a non-metal precursor of a selenium precursor, a sulfur precursor, or a combination thereof in an organic solvent in the presence of the core and the organic ligand in a plurality of steps to provide a semiconductor nanocrystal shell having the aforementioned composition including zinc, selenium, and sulfur on the surface of the core.

The providing a semiconductor nanocrystal shell may include reacting the zinc precursor and the selenium precursor and then reacting the zinc precursor and the sulfur precursor.

The core may be obtained by preparing a zinc precursor mixture, for example, a solution including a zinc precursor and an organic ligand; preparing a selenium precursor and a tellurium precursor; heating the zinc precursor mixture, e.g., solution, to a first reaction temperature, and adding the selenium precursor and the tellurium precursor, and optionally together with an organic ligand to proceed a reaction.

The zinc precursor may include a Zn metal powder, ZnO, an alkylated Zn compound (e.g., a C2 to C30 dialkyl zinc such as diethyl zinc), a zinc alkoxide (e.g., e.g., a C2 to C30 dialkyl zinc alkoxide such as a zinc ethoxide), a zinc carboxylate (e.g., e.g., a C2 to C30 zinc carboxylate such as a zinc acetate), a zinc nitrate, a Zn perchlorate, a zinc sulfate, a zinc acetylacetonate, a zinc halide (e.g., a zinc chloride), a zinc cyanide, a zinc hydroxide, a zinc carbonate, a zinc peroxide, or a combination thereof. Examples of the zinc precursor may include dimethyl zinc, diethyl zinc, zinc acetate, zinc acetylacetonate, zinc iodide, and zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The organic solvent may include a C6 to C22 primary amine such as hexadecylamine, a C6 to C22 secondary amine such as a dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl amine) substituted with at least one (e.g., 1, 2, or 3) C6 to C22 alkyl group, a primary, secondary, or tertiary phosphine oxide (e.g., trioctylphosphine oxide) such as (e.g., 1, 2, or 3) substituted with a C6 to C22 alkyl group, a C12 to C22 aromatic ether such as a phenyl ether, a benzyl ether, or a combination thereof, but are not limited thereto.

For the first semiconductor nanocrystal or the semiconductor nanocrystal particles, a content of the selenium precursor used (e.g., during core synthesis) may be greater than or equal to about 10 moles, greater than or equal to about 15 moles, greater than or equal to about 20 moles, greater than or equal to about 25 moles, greater than or equal to about 30 moles, greater than or equal to about 35 moles, greater than or equal to about 40 moles, or greater than or equal to about 45 moles, based on 1 mole of the tellurium precursor. The amount of the selenium precursor may less than or equal to about 60 moles, less than or equal to about 59 moles, less than or equal to about 58 moles, less than or equal to about 57 moles, less than or equal to about 56 moles, or less than or equal to about 55 moles, based on 1 mole of the tellurium precursor. Within the disclosed contents, the core of the composition described herein may be formed.

A content of selenium used for the production of the first semiconductor nanocrystal may be greater than or equal to about 0.1 moles, greater than or equal to about 0.3 moles, greater than or equal to about 0.5 moles, greater than or equal to about 0.7 moles, or greater than or equal to about 1 mole, per 1 mole of zinc. The amount of selenium used for the production of the first semiconductor nanocrystal may be less than or equal to about 5 moles, less than or equal to about 4 moles, less than or equal to about 3 moles, less than or equal to about 2 moles, or less than or equal to about 1 mole, per 1 mole of zinc.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

The reaction conditions such as a reaction temperature, time, and the like for providing a shell may be appropriately determined taking into consideration the desired shell composition. According to an embodiment, a solvent and, optionally, an organic ligand is heated (or subjected to vacuum) at a predetermined temperature (e.g., greater than or equal to about 100° C.) under vacuum and heated again at a predetermined temperature (e.g., greater than or equal to about 100° C.) with changing to an inert gas atmosphere. Subsequently, the reaction may be performed by adding a core, sequentially or simultaneously adding shell precursors, and heating the same a predetermined reaction temperature. The shell precursors may be formed to a shell having a desired composition (e.g., having a gradient or a multi-layered) by sequentially adding mixtures at a different ratio for a reaction time. In an embodiment, a zinc precursor and a selenium precursor are reacted to provide a first layer, and subsequently, a zinc precursor and a sulfur precursor are reacted to provide a second layer. The reaction temperature for forming a shell may be greater than or equal to about 280° C., for example, greater than or equal to about 290° C., or greater than or equal to about 300° C. and less than or equal to about 350° C., less than or equal to about 340° C., less than or equal to about 330° C., for example, less than or equal to about 325° C.

Amounts and concentrations of each precursor in the reaction system for forming a shell may be determined taking into consideration a composition of the desired core and shell (or semiconductor nanocrystal particles) and a reactivity between precursors.

After completing the reaction, a nonsolvent may be added to the reaction products and nanocrystal particles coordinated with the ligand compound may be separated (which hereinafter, may be referred to as a nonsolvent precipitation). The nonsolvent may be a polar solvent that is miscible with the solvent used in the core formation reaction, the shell formation reaction, or a combination thereof and is not capable of dispersing the produced nanocrystals therein. The nonsolvent may be selected depending the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The nanocrystal particles may be separated through centrifugation, sedimentation, chromatography, or distillation. The separated nanocrystals may be added to a washing solvent and washed, if desired. The washing solvent has no particular limit and may have a similar solubility parameter to that of the ligand and may, for example, include hexane, heptane, octane, chloroform, toluene, benzene, and the like.

The quantum dots of an embodiment may be non-dispersible or non-aqueous to water, the aforementioned nonsolvent, or a combination thereof.

The quantum dots before processing (or semiconductor nanocrystals before processing) synthesized in an embodiment are dispersed in an organic solvent to provide a mixture, for example a solution. The organic solvent may be a C6 to C40 aliphatic hydrocarbon (e.g., alkane, alkene, alkyne, etc.), a C6 to C40 substituted or unsubstituted aromatic hydrocarbon (e.g., toluene, xylene, etc.), a C3 to C30 secondary or tertiary amine solvent, or a combination thereof.

A gallium treatment agent and, optionally, a sulfur treatment agent are added into the mixture, for example a solution, and heated at a temperature of greater than or equal to about 180° C. (hereinafter, surface-treatment temperature), and the surface of the pristine quantum dot (or semiconductor nanocrystal particle) is modified with the treatment agents (hereinafter, also referred to as a surface-treatment). By the surface treatment, at least a portion of ligand (e.g., a carboxylic acid ligand such as oleic acid) originally present on the surface of the pristine quantum dot may be substituted by the surface treatment agent.

The gallium treatment agent includes a gallium compound and a primary amine. The gallium compound may include alkylated gallium (e.g., gallium compound including same or different three C1 to C20 alkyl groups). In an embodment, the gallium treatment agent may not include oxygen. The primary amine is the same as described herein.

In the gallium treatment agent, a ratio, e.g., mole ratio, between the gallium compound and the primary amine may be appropriately determined, and may be not particularly limited. Without being bound by theory, it is believed that in the gallium treatment agent, the primary amine may form a bond with gallium, and that gallium or a gallium moiety in the treatment agent may be bonded on the surface of quantum dots by a cation exchange reaction with zinc or may passivate a dangling, i.e., open bond of chalcogen atom (e.g., sulfur).

The gallium compound (e.g., gallium alkylate or organic solvent dispersion thereof) is mixed with the primary amine, and optionally, heated at a predetermined temperature, for example, of greater than or equal to about 40° C., or greater than or equal to about 50° C. and less than or equal to about 100° C. to provide a gallium treatment agent.

The sulfur treatment agent may include a bis(substituted or unsubstituted alkyl) sulfide compound (e.g., a bis(trialkylsilylalkyl) sulfide compound), a thiol compound having a C1 to C30 aliphatic/aromatic hydrocarbon group (e.g., alkyl group), a sulfur-alkylphosphine compound, or a combination thereof. The sulfur treatment agent may be bonded to the zinc dangling bond present on the surface of quantum dots, and the gallium treatment agent may be bonded to the bonded sulfur moiety to passivate a sulfur dangling bond.

The surface treatment temperature may be greater than or equal to about 180° C., for example, greater than or equal to about 190° C. and less than or equal to about 350° C., for example, less than or equal to about 300° C., or less than or equal to about 250° C.

A content of gallium treatment agent to be used may be appropriately selected taking into consideration the surface treatment temperature, the type of the original ligand present on the surface of the quantum dots or the semiconductor nanocrystal particles. The amount of the gallium treatment agent used may be greater than or equal to about 0.05 moles, greater than or equal to about 0.1 moles, for example, greater than or equal to about 0.15 moles, greater than or equal to about 0.2 moles, greater than or equal to about 0.25 moles, greater than or equal to about 0.3 moles, greater than or equal to about 0.4 moles, greater than or equal to about 0.5 moles, and less than or equal to about and 5 moles, less than or equal to about 2 moles, or less than or equal to about 1 mole, based on 1 mole of the main metal (e.g., zinc) included in the quantum dot. The main metal included in the quantum dot means the metal with the maximum content. When used, a content of the sulfur treatment agent may be appropriately selected taking into consideration the surface treatment temperature, the type of the original ligand present on the surface of the quantum dots or the semiconductor nanocrystal particles. The amount of the sulfur treatment agent may be greater than or equal to about 0.05 moles, greater than or equal to about 0.1 moles, greater than or equal to about 0.15 moles, greater than or equal to about 0.2 moles, greater than or equal to about 0.25 moles, greater than or equal to about 0.3 moles, greater than or equal to about 0.4 moles, greater than or equal to about 0.5 moles, greater than or equal to about and 5 moles, less than or equal to about 4 moles, less than or equal to about 3 moles, less than or equal to about 2 moles, or less than or equal to about 1 mole, based on 1 mole of gallium. When used, a content of the sulfur treatment agent may be greater than or equal to about 0.05 moles, greater than or equal to about 0.1 moles, greater than or equal to about 0.15 moles, greater than or equal to about 0.2 moles, greater than or equal to about 0.25 moles, greater than or equal to about 0.3 moles, greater than or equal to about 0.4 moles, greater than or equal to about 0.5 moles, greater than or equal to about to 5 moles, and less than or equal to about 4 moles, less than or equal to about 3 moles, less than or equal to about 2 moles, or less than or equal to about 1 mole, per 1 mole of gallium of the gallium treatment agent.

After the surface exchange reaction, the surface-treated quantum dots or semiconductor nanocrystal particles may be separated according to the aforementioned non-solvent precipitation method.

In an embodiment, an electronic device includes the aforementioned semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescence element (e.g., a lighting such as a quantum dot sheet or a quantum dot rail or a liquid crystal display (LCD)) or an electroluminescent device (e.g., QD LED).

In an embodiment, the electronic device may include a quantum dot sheet and the aforementioned semiconductor nanocrystal particle may be included in the quantum dot sheet (e.g., in a form of a semiconductor nanocrystal-polymer composite).

In an embodiment, the electronic device may be an electroluminescent device. The electronic device may include an anode 1 and a cathode 5 facing each other and a quantum dot emission layer 3 disposed between the anode and the cathode and including a plurality of quantum dots, and the plurality of quantum dots may include the aforementioned semiconductor nanocrystal particle (refer to FIG. 1).

The cathode may include an electron injection conductor having a low work function. The anode may include a hole injection conductor having a relatively high work function. The electron/hole injection conductor may include a metal-based material (e.g., aluminum, magnesium, tungsten, nickel, cobalt, platinum, palladium, calcium, LiF, and the like) (e.g., a metal, a metal compound, an alloy, a combination thereof), a metal oxide such as gallium indium oxide or indium tin oxide, or a conductive polymer such as polyethylene dioxythiophene (e.g., having a relatively high work function), but is not limited thereto.

The cathode, the anode, or both the cathode and the anode may be a light transmitting electrode or a transparent electrode. In an embodiment, both the anode and the cathode may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, the non-light transmitting electrode may be made of, for example, an opaque conductor such as aluminum (Al), a lithium aluminum (Li:Al) alloy, a magnesium-silver alloy (Mg;Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode and the cathode are not particularly limited and may be selected taking into consideration device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 um, less than or equal to about 1 μm, less than or equal to about 900 nm, less than or equal to about 500 nm, or less than or equal to about 100 nm, but is not limited thereto.

The quantum dot emission layer includes a plurality of quantum dots. The plurality of quantum dots includes the blue light emitting semiconductor nanocrystal particle according to the aforementioned embodiments. The quantum dot emission layer may include a monolayer of the blue light emitting semiconductor nanocrystal particles.

The emission layer may be formed by preparing a dispersion including quantum dots dispersed in a solvent, applying the dispersion by spin coating, inkjet coating, or spray coating, and drying it. A thickness of the emission layer may be greater than or equal to about 5 nm, for example, greater than or equal to about 10 nm, greater than or equal to about 15 nm, greater than or equal to about 20 nm, or greater than or equal to about 25 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include charge (hole or electron) auxiliary layers between the anode and the cathode. For example, the electronic device may include a hole auxiliary layer 2 or an electron auxiliary layer 4 between the anode and the quantum dot emission layer, between the cathode and the quantum dot emission layer, or a combination thereof. (see FIG. 1)

Meanwhile, in FIG. 1, the hole/electron auxiliary layer is illustrated as having a structure formed as a single layer, but the structure is not limited thereto, and they may be formed as a plurality of layers in which two or more layers are stacked.

The hole auxiliary layer may include for example a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be appropriately selected. For example, each thickness of the layer may be greater than or equal to about 1 nm and less than or equal to about 500 nm, but is not limited thereto. The hole injection layer may be an organic layer that is formed by a solution-type process (e.g., spin coating etc.) such as poly(3,4-ethylenedioxythiophene):poly(styrene sulfonate) (PEDOT:PSS). The hole transport layer may be an organic layer that is formed by a solution-type process (e.g., spin coating etc.).

The electron auxiliary layer may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be appropriately selected. For example, a thickness of each layer may be greater than or equal to about 1 nm and less than or equal to about 500 nm, but is not limited thereto. The electron injection layer may be an organic layer formed by deposition. The electron transport layer may include an inorganic oxide nanoparticle or may be an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be an organic compound having hole or electron-related properties. The inorganic material may be for example a metal oxide such as molybdenum oxide, tungsten oxide, zinc oxide, or nickel oxide, but is not limited thereto.

The hole injection/transport layer (HTL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, NN,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include for example poly(3,4-ethylenedioxythiophene):poly(styrene sulfonate) (PE DOT:PSS), poly(9,9-dioctyl-fluorene-co-N-(4-butylphenyl)-diphenylamine) (TFB) polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

The electron transport layer (ETL) may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, 8-(4-(4,6-di(naphthalen-2-yl)-1,3,5-triazin-2-yl)phenyl)quinolone (ET204), 8-hydroxyquinolinato lithium (Liq), 2,2',2"-(1,3,5-Benzinetriyl)-tris(1-phenyl-1-H-benzimidazole) (TPBi), an n-type metal oxide (e.g., zinc oxide, $HfO_2$, etc.), 8-(4-(4,6-di(naphthalen-2-yl)-1,3,5-triazin-2-yl)phenyl)quinolone:8-hydroxyquinolinato lithium (ET204:Liq), or a combination thereof, but is not limited thereto. Herein, q is 8-hydroxyquinoline, BTZ is 2-(2-hydroxyphenyl)benzothiazolate, and Bq is 10-hydroxybenzo[h]quinoline.

The hole blocking layer (HBL) may include for example 1,4,5,8-naphthalene-tetracarboxylic dianhydride (NTCDA), bathocuproine (BCP), tris[3-(3-pyridyl)-mesityl]borane (3TPYMB), LiF, $Alq_3$, Gaq3, Inq3, Znq2, $Zn(BTZ)_2$, $BeBq_2$, or a combination thereof, but is not limited thereto.

Figure 2:
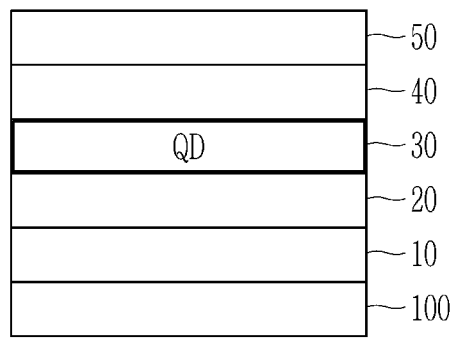
FIG. 2 is a schematic cross-sectional view of a QD LED device according to an embodiment.

In a device according to an embodiment, an anode 10 disposed on a transparent substrate 100 may include a metal oxide-based transparent electrode (e.g., ITO electrode) and a cathode 50 facing the anode may include a metal (Mg, Al, etc.) of a relatively low work function. The hole auxiliary layer 20, for example, a hole transport layer including TFB, poly(9-vinylcarbazole) (PVK), or a combination thereof; a hole injection layer including, for example, PEDOT:PSS, a p-type metal oxide, or a combination thereof; or a combination thereof, may be disposed between the transparent electrode 10 and the emission layer 30. An electron auxiliary layer 40 such as an electron injection layer/transport layer may be disposed between the quantum dot emission layer 30 and the cathode 50. (see FIG. 2)

Figure 3:
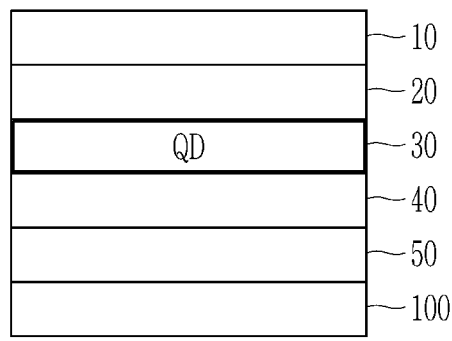
FIG. 3 is a schematic cross-sectional view of a QD LED device according to an embodiment.

A device according to an embodiment has an inverted structure. Herein, a cathode 50 disposed on a transparent substrate 100 may include a metal oxide-based transparent electrode (e.g., ITO) and an anode 10 facing the cathode may include a metal (e.g., Au, Ag, etc.) of a relatively high work function. For example, an n-type metal oxide (ZnO) may be disposed between the transparent electrode 50 and the emission layer 30 as an electron auxiliary layer (e.g., an electron transport layer) 40. $MoO_3$ or another p-type metal oxide may be disposed between the metal anode 10 and the quantum dot emission layer 30 as a hole auxiliary layer (e.g., a hole transport layer including TFB, PVK, or a combination thereof; a hole injection layer 20 including $MoO_3$ or other p-type metal oxide; or a combination thereof). (refer to FIG. 3)

The electroluminescent device according to an embodiment may show, e.g., exhibit, a maximum external quantum efficiency (EQE) of greater than or equal to about 4%, for example, greater than or equal to about 4.5%, or greater than or equal to about 5% and a maximum luminance of greater than or equal to about 20,000 $cd/m^2$, for example, greater than or equal to about 25,000 $cd/m^2$, greater than or equal to about 26,000 $cd/m^2$, or greater than or equal to about 27,000 $cd/m^2$.

Hereinafter, specific examples are illustrated. However, these examples are exemplary, and the present disclosure is not limited thereto.

EXAMPLES

Analysis Method

1. Photoluminescence Analysis and Time resolved PL analysis (TRPL)

A photoluminescence (PL) spectrum of the produced nanocrystals are obtained using a Hitachi F-7100 spectrophotometer or Absolute PL Quantum yield spectrometer Quantaurus (HAMAMATSU) at an irradiation wavelength of 372 nanometers (nm).

Using fluorescence lifetime spectrometer ("picoquant fluotime 300" by PicoQuant Co. Ltd.), a TRPL analysis is carried out.

2. Inductively Coupled Plasma (ICP) Analysis

An inductively coupled plasma-atomic emission spectroscopy (ICP-AES) analysis is performed using Shimadzu ICPS-8100.

3. Transmission Electron Microscopy (TEM) and TEM-Energy Dispersive X-Ray (EDX) analysis Transmission electron microscopy analysis of the produced nanocrystals is performed using a UT F30 Tecnai electron microscope.

4. Gas Chromatography (GC) Analysis

GC analysis is performed using a 7000 Triple Quad MS (Agilent Technologies).

5. Thermogravimetric Analysis (TGA)

TGA is performed using Discovery DSC (TA Instruments).

6. X-ray photoelectron spectroscopy (XPS)

XPS analysis is performed using X-ray photoelectron spectroscopy (manufacturer: Physical Electronics, model name: Quantum2000).

7. Evaluation of Electroluminescence Properties

Electroluminescence properties are evaluated using a Keithley 2200 source measuring device and a Minolta CS2000 spectroradiometer (current-voltage-luminance measuring device).

Syntheses are performed under inert gas atmospheres (nitrogen flowing conditions) unless particularly mentioned. In the following examples, unless otherwise indicated, the (content) ratio between precursors refers to a mole ratio.

Comparative Example 1

1. Selenium, sulfur, and tellurium are dispersed in trioctylphosphine (TOP) to provide a 2 moles per liter (molar (M)) Se/TOP stock solution and a 2 M sulfur/TOP stock solution and a 0.1 M Te/TOP stock solution.

Zinc acetate is dissolved together with palmitic acid into trioctylamine in a 300 milliliter (mL) reaction flask and heated at 120° C. under vacuum. An atmosphere in the reactor is changed to inert gas after 1 hour.

After heating at 300° C., the prepared Se/TOP stock solution and Te/TOP stock solution are rapidly injected thereto at a predetermined Te:Se ratio. After 60 minutes, the reaction solution has been rapidly cooled at a room temperature, then the acetone is added thereto to provide a precipitate, which is centrifuged, and the precipitate is dispersed in toluene to provide a ZnSeTe core.

The mole ratio (Zn:Se) of the used Zn precursor and Se precursor is 2:1, and the mole ratio of Te to Se is 0.03:1.

2. Trioctylamine (TOA) is added into a 300 mL reaction flask, and zinc acetate and oleic acid are added at a mole ratio of 1:2 and subjected to vacuum at 120° C. Inside of the flask is substituted with nitrogen ($N_2$). A toluene dispersion of the prepared ZnSeTe core is rapidly added thereto while heating the reaction flask at 300° C., and subsequently added with the Se/TOP stock solution and reacted for 120 minutes to provide a ZnSe layer on the core. Subsequently, the S/TOP stock solution is added together with zinc acetate and reacted for 120 minutes to provide a ZnS layer on the ZnSe layer. A mole number of each precursor is adjusted to provide a composition which will be described herein.

After the reaction, the flask is cooled at a room temperature and acetone added to provide a precipitate, and the precipitate is centrifuged to provide quantum dots. The obtained quantum dots are dispersed in hexane.

Figure 4A:
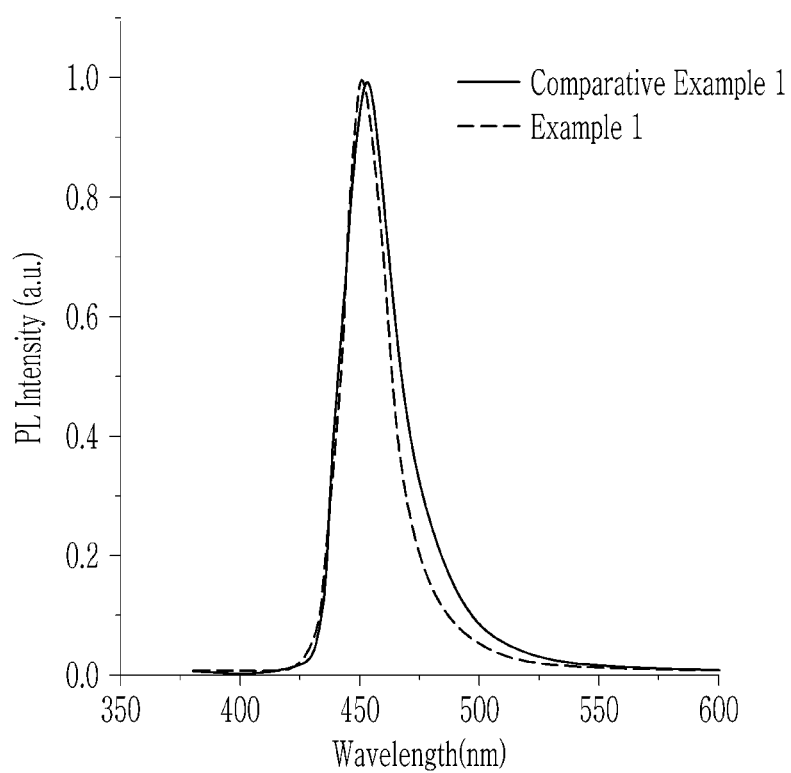
FIG. 4A is a graph of photoluminescence (PL) intensity (arbitrary units (a.u.), normalized) versus wavelength (nm) showing photoluminescence spectra of quantum dots synthesized in Example 1 and Comparative Example 1.

A photoluminescence characteristic analysis was performed on the obtained quantum dots, and the results are shown in FIG. 4A.

Example 1

Triethylgallium is added in trioctylphosphine and agitated at 25° C. to provide a 0.4 M of gallium-trioctylphosphine, and then is mixed with oleylamine to provide a gallium treatment agent. Bis(trimethylsilylmethyl)sulfide is dissolved in trioctylphosphine to prepare a sulfur treatment agent (0.5 M).

Quantum dots prepared in accordance with the same procedure as in Comparative Example 1 are dispersed in trioctylamine in a 300 mL flask, and the gallium treatment agent and the sulfur treatment agent are injected thereto at a mole ratio of 1:1, and the temperature is increased to 200° C. and maintained for 30 minutes.

After completing the reaction, the flask is cooled to room temperature and ethanol is added to provide a precipitate, and the precipitate is centrifuged to provide quantum dots. The obtained quantum dots are dispersed in hexane.

Figure 6:
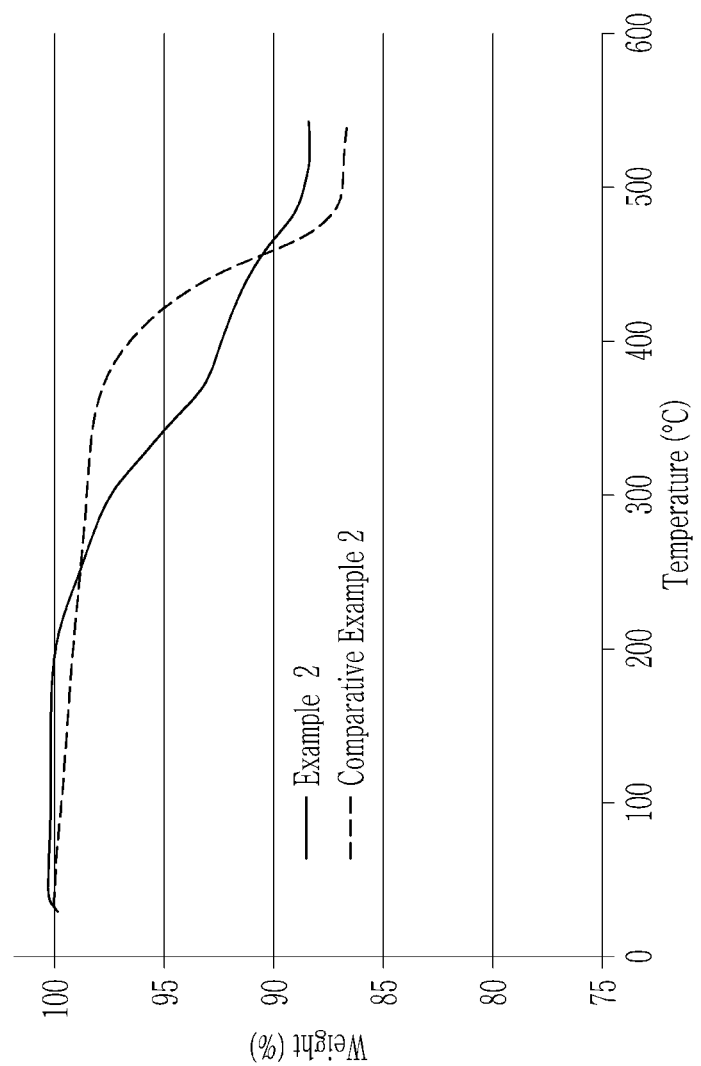
FIG. 6 is a graph of weight (percent (%)) versus temperature (° C.) showing the results of thermogravimetric analysis (TGA) of quantum dots in Example 2 and Comparative Example 2.

A photoluminescence characteristic analysis was performed on the obtained quantum dots, and the results are shown in FIG. 4A. A thermogravimetric analysis was performed on the obtained quantum dots, and the results are shown in FIG. 6.

Figure 7:
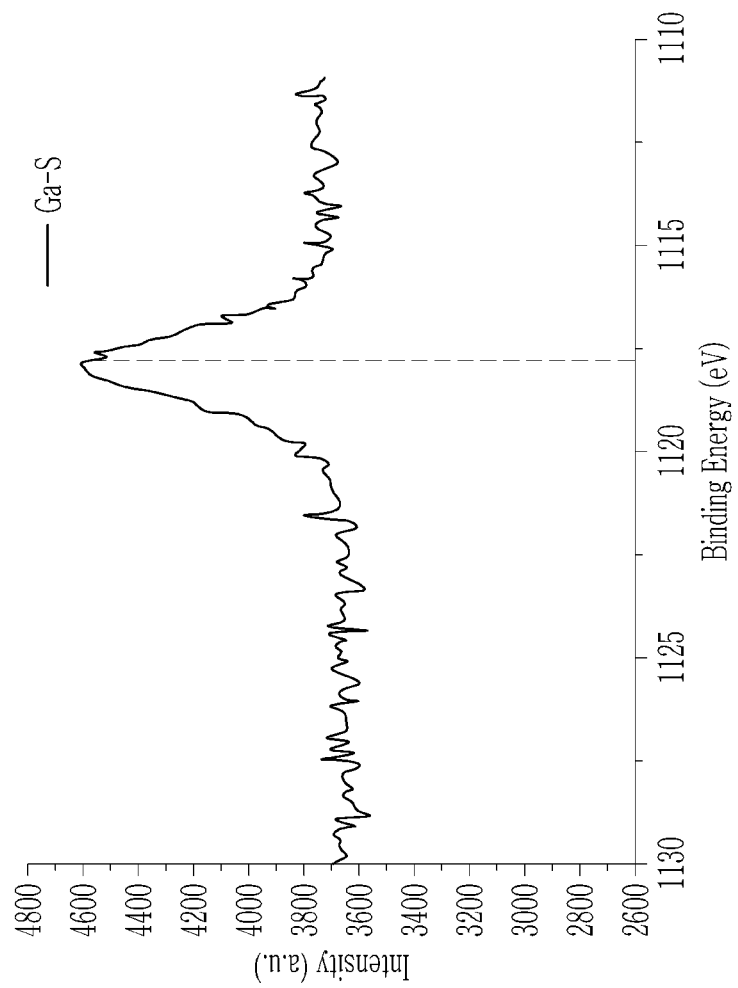
FIG. 7 is a graph of Intensity (a.u.) versus Binding Energy (electronvolts (eV)) showing the X-ray photoelectron spectroscopy (XPS) analysis results for the quantum dots of Example 2.

An X-ray spectrophotometry analysis was performed on the obtained quantum dots, and a portion of the results are shown in FIG. 7. The results of FIG. 7 (Ga—S binding energy (1117.5 electronvolts (eV))) suggest that the obtained quantum dots include a moiety having a gallium-sulfur bond.

Comparative Example 2

1. Quantum dots are prepared in accordance with the same procedure as in Comparative Example 1, except that the amount of tellurium is increased to about 0.07 mole per 1 mole of selenium when synthesizing a core.

2. An ICP-AES and TEM analysis was performed on the obtained quantum dots, and some of the results are shown in Table 1. An average size of the quantum dots is about 12 nm.

Figure 4B:
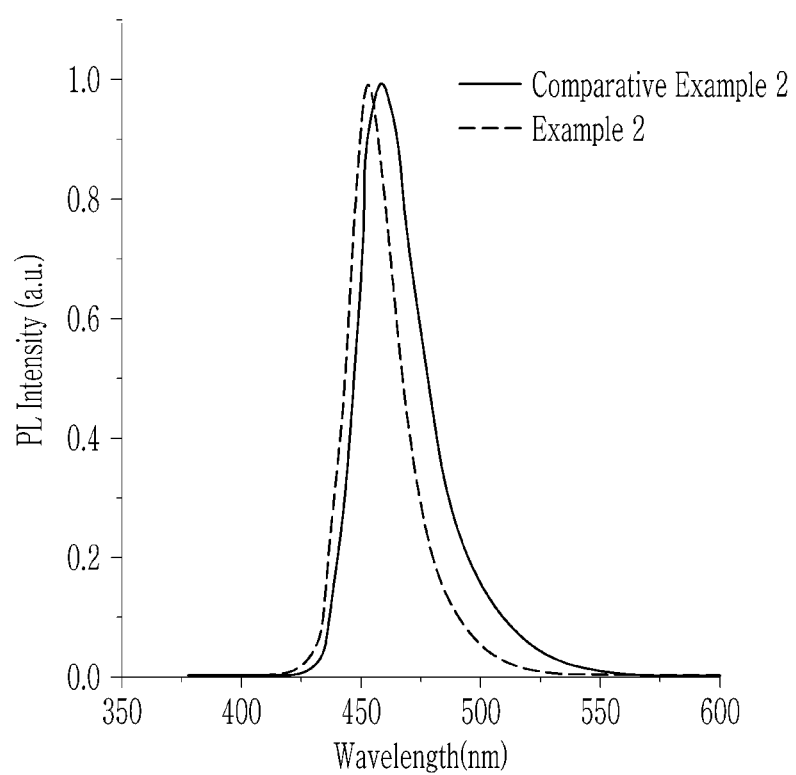
FIG. 4B is a graph of PL intensity (a.u., normalized) versus wavelength (nm) showing photoluminescence spectra of quantum dots synthesized in Example 2 and Comparative Example 2.

A photoluminescence characteristic analysis was performed on the obtained quantum dots, and the results are shown in FIG. 4B.

Figure 5:
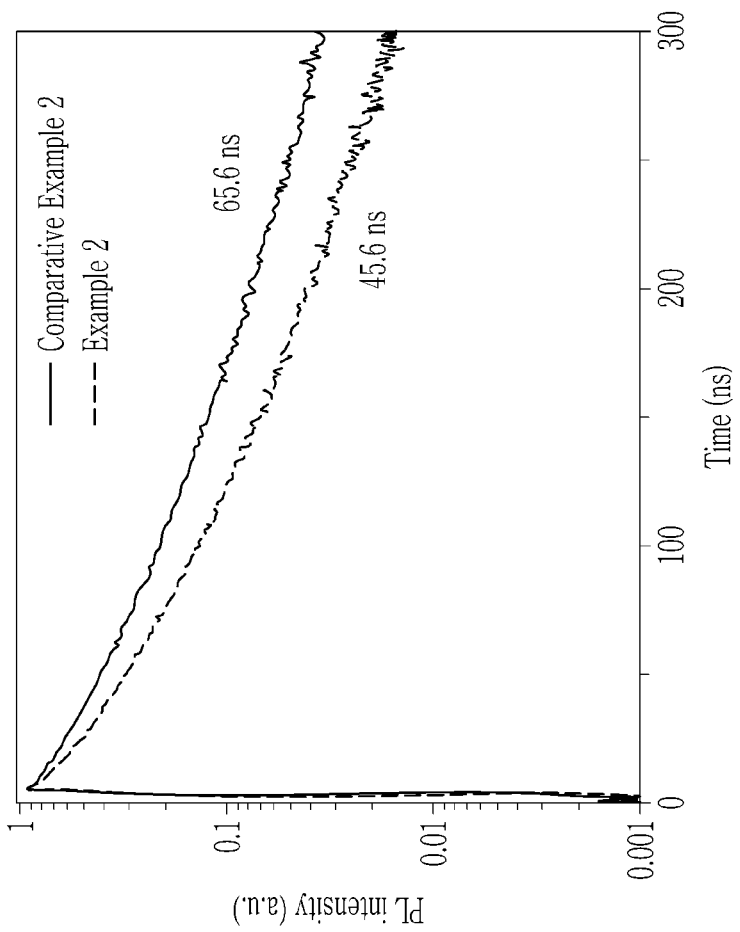
FIG. 5 is a graph of PL intensity (a.u., normalized) versus time (ns) showing time-resolved photoluminescence spectra of quantum dots synthesized in Example 2 and Comparative Example 2.

A time-resolved photoluminescence analysis was performed on the obtained quantum dots, and the results are shown in FIG. 5.

The obtained quantum dots are formed with a thermogravimetric analysis, and the results are shown in FIG. 6.

Example 2

1. Quantum dots are prepared in accordance with the same procedure as in Example 1, except that the quantum dots obtained from Comparative Example 2 is used.

2. Analysis

An ICP-AES and TEM analysis was performed on the obtained quantum dots, and some of the results are shown in Table 1. An average size of the quantum dots is about 12 nm. Average solidity and roundness is 0.93 and 0.82, respectively.

A photoluminescence characteristic analysis was performed on the obtained quantum dots, and the results are shown in Table 2 and FIG. 4B.

A time-resolved photoluminescence analysis was performed on the obtained quantum dots, and the results are shown in FIG. 5. From the results of the time-resolved photoluminescence (TRPL) analysis, it is confirmed that quantum dots according to Comparative Example 2 have a Te relative emission (t3=about 58 ns) of 59%, on the other hand, quantum dots of which the surface is treated with a gallium treatment agent and a sulfur treatment agent have a decreased Te relative emission (t3) of 48%. From the results of TRPL analysis, quantum dots according to Example 2 show, e.g., exhibit, an average decay time of about 45.6 ns, which is shorter than that (e.g., about 65.6 ns) of the quantum dots according to Comparative Example 2.

A thermogravimetric analysis was performed on the obtained quantum dots are formed with a thermogravimetric analysis, and the results are shown in FIG. 6. As shown in FIG. 6, it is confirmed that quantum dots according to Comparative Example 2 show, e.g., exhibit, a 5% weight decrease temperature of greater than 400° C.; on the other hand, quantum dots according to Example 2 show, e.g., exhibit, a 5% weight decrease temperature of less than 350° C. The results suggest that an organic material on the surface of quantum dots have been converted (e.g., to oleyl amine, etc.).

Example 3

Quantum dots are prepared in accordance with the same procedure as in Example 2, except that the sulfur treatment agent is not injected.

An ICP-AES and TEM analysis was performed on the obtained quantum dots, and some of the results are shown in Table 1. An average size of the quantum dots is about 12 nm. Average solidity and roundness is 0.94 and 0.84, respectively.

A photoluminescence characteristic analysis was performed on the obtained quantum dots, and the results are shown in Table 2. An XPS analysis was performed on the obtained quantum dots. The results confirm the presence of a Ga-amine bond.

Comparative Example 3-1

Quantum dots are prepared in accordance with the same procedure as in Example 2, except that the gallium treatment agent is not injected.

A photoluminescence characteristic analysis was performed on the obtained quantum dots, and the results are shown in Table 2.

Comparative Example 3-2

Quantum dots are prepared in accordance with the same procedure as in Example 3, except that oleylamine is used instead of the gallium treatment agent.

Comparative Example 4-1

Diethylzinc and oleylamine are added into trioctylphosphine and agitated at a room temperature (25° C.) to provide a zinc-amine treatment agent (0.4 M).

Quantum dots are prepared in accordance with the same procedure as in Example 2, except that a zinc-amine treatment agent is used instead of the gallium treatment agent.

Comparative Example 4-2

Quantum dots are prepared in accordance with the same procedure as in Example 2, except that gallium acetylacetonate ($Ga(Acac)_3$) is used as a gallium treatment agent instead of diethylgallium.

A photoluminescence characteristic analysis was performed on the obtained quantum dots, and the results are shown in Table 2.

TABLE 1

| Sample | Mole ratio (to Zn) | | | | Mole ratio | |
|---|---|---|---|---|---|---|
| | S | Zn | Se | Ga | S:Se | Te:Se |
| Comparative Example 2 | 0.407 | 1.000 | 0.483 | — | 0.84:1 | 0.00784:1 |
| Example 3 (Ga-amine) | 0.392 | 1.000 | 0.472 | 0.697 | 0.84:1 | 0.00543:1 |
| Example 2 (Ga-S) | 0.425 | 1.000 | 0.478 | 0.209 | 0.90:1 | 0.00884:1 |

TABLE 2

| | PL peak | | Absolute |
|---|---|---|---|
| Sample | Wavelength (nm) | FWHM (nm) | Quantum Yield (QY) (%) |
| Comparative Example 2 | 459 | 33 | 88 |
| Example 2 | 453 | 23 | 83 |
| Comparative Example 3-1 | 455 | 27 | 42 |
| Comparative Example 3-2 | 458 | 32 | 67 |
| Example 3 | 457 | 30 | 86 |
| Comparative Example 4-1 | 459 | 32 | 79 |
| Comparative Example 4-2 | 459 | 33 | 79 |

From the results of Table 2, it is confirmed that quantum dots according to Examples 2 and 3 may show, e.g., exhibit, improved luminescence properties compared to the quantum dots according to Comparative Examples 2, 3-1, 3-2, 4-1, and 4-2.

When gallium acetylacetonate (Ga(Acac)) is used as a gallium treatment agent, there is no luminescence property improvement of the treated quantum dots, and from the TEM results, it is confirmed that the byproduct of gallium oxide is formed.

From the results of FIGS. 4A and 4B, it is confirmed that the surface-treated quantum dots according to Examples 1 and 2 show, e.g., exhibit, a decreased tail emission and a further decreased full width at half maximum (FWHM) compared with quantum dots according to Comparative Examples 1 and 2. From the results of Table 2, it is confirmed that the photoluminescence peak wavelength of the surface-treated quantum dots of Examples 2 and 3 may show, e.g., exhibit, blue shift (e.g., from 459 nm to 453 nm or 457 nm), compared with quantum dots according to Comparative Examples 2.

Comparative Example 5

Quantum dots are prepared in accordance with the same procedure as in Comparative Example 2, except that the ZnS shell thickness is decreased to ¼, e.g., by 75%.

A photoluminescence characteristic analysis was performed on the obtained quantum dots, and the results are shown in Table 3.

Example 4

The surface treatment reaction is performed in accordance with the same procedure as in Example 3, except that quantum dots obtained from Comparative Example 5 are used.

A photoluminescence analysis was performed on the obtained quantum dots, and the results (relative QY) are shown in Table 3.

TABLE 3

| | Relative QY | Full width at half maximum (FWHM) |
|---|---|---|
| Comparative Example 5 | 100% | 37 nm |
| Example 4 | 106% | 31 nm |

From the results of Table 3, it is confirmed that quantum dots of Example 4 may show, e.g., exhibit, an improvement in both of a QY and a full width at half maximum (FWHM) compared with Comparative Example 5.

Example 6

Using quantum dots of Example 2, an electroluminescent device is fabricated in accordance with the following method:

Poly(3,4-ethylenedioxythiophene):poly(styrene sulfonate) (PEDOT:PSS) and poly(9-vinylcarbazole) (PVK) layers are each formed on a glass substrate deposited with an indium tin oxide (ITO) electrode (anode) according to a spin coating method as a hole injection layer (HIL) and a hole transport layer (HTL), respectively. An octane dispersion of quantum dots is spin-coated on the formed PVK layer to provide a quantum dot emission layer. 2,2,2"-(1,3,5-benzinetriyl)-tris(1-phenyl-1-H-benzimidazole) (TPBi) is formed on the quantum dot emission layer as an electron auxiliary layer, and then an Al electrode is formed by deposition.

The obtained device is measured for electroluminescence characteristics. The results show, e.g., demonstrate, that the obtained electroluminescent device may show, e.g., exhibit, relatively high electroluminescence properties (maximum external quantum efficiency (EQE) of greater than or equal to about 5% and maximum luminance of about 28,000 candelas per square meter (cd/m$^2$)).

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A quantum dot, comprising:
   a core comprising a first semiconductor nanocrystal comprising zinc, selenium, and tellurium, and
   a semiconductor nanocrystal shell on the core, the semiconductor nanocrystal shell comprising a zinc chalcogenide,
   wherein the quantum dot does not comprise cadmium,
   the zinc chalcogenide comprises zinc and selenium,
   the quantum dot further comprises gallium and a primary amine having 5 or more carbon atoms, and
   the quantum dot is configured to emit light having a maximum emission peak in a range of greater than about 450 nanometers and less than or equal to about 480 nanometers by excitation light.

2. The quantum dot of claim 1, wherein the maximum emission peak has a full width at half maximum of less than about 33 nanometers.

3. The quantum dot of claim 1, wherein a maximum emission peak wavelength of the quantum dot is greater than or equal to about 453 nanometers.

4. The quantum dot of claim 1, wherein the first semiconductor nanocrystal or the quantum dot does not comprise a Group III-V compound.

5. The quantum dot of claim 1, wherein in the quantum dot, a mole ratio of tellurium to selenium is greater than or equal to about 0.0053:1.

6. The quantum dot of claim 1, wherein in the quantum dot, a mole ratio of gallium to zinc is greater than or equal to about 0.1:1.

7. The quantum dot of claim 1, wherein
   the zinc chalcogenide further comprises sulfur, and
   in the quantum dot, a mole ratio of selenium to zinc is greater than or equal to about 0.46:1 and a mole ratio of sulfur to selenium is less than or equal to about 0.93:1.

8. The quantum dot of claim 1, wherein the quantum dot has an average decay time for the excitation light of less than or equal to about 50 nanoseconds, as determined by a time-resolved photoluminescence analysis.

9. The quantum dot of claim 1, wherein the quantum dot has a tellurium relative emission of less than or equal to about 50%, as determined by a time-resolved photoluminescence analysis.

10. The quantum dot of claim 1, wherein in a gas chromatography mass spectrometry, the quantum dot exhibits a peak of a primary carboxylic acid compound having 10 or more carbon atoms and a peak of the primary amine, and a peak intensity ratio of the peak of the primary amine to the peak of the primary carboxylic acid compound is greater than or equal to about 0.5:1.

11. The quantum dot of claim 10, wherein a peak intensity ratio of the peak of the primary amine to the peak of the primary carboxylic acid compound is greater than or equal to about 1:1.

12. The quantum dot of claim 1, wherein the quantum dot has a quantum efficiency of greater than or equal to about 75%.

13. The quantum dot of claim 1, wherein the quantum dot has a 5% weight loss temperature of less than about 400° C., as determined by a thermogravimetric analysis.

14. The quantum dot of claim 1, wherein in a thermogravimetric analysis, the quantum dot has an organic material content of less than or equal to about 12 weight percent, as determined by a thermogravimetric analysis.

15. A method of producing the quantum dot of claim 1, comprising
   adding a quantum dot comprising
      a core comprising a first semiconductor nanocrystal comprising zinc, selenium, and tellurium, and
      a semiconductor nanocrystal shell on the core, the semiconductor nanocrystal shell comprising a zinc chalcogenide to an organic solvent to prepare a mixture; and
   adding a gallium treatment agent comprising a gallium compound and a primary amine, and optionally a sulfur treatment agent, to the mixture, and
   heating the mixture to a temperature of greater than or equal to about 180° C.

16. The method of claim 15, wherein the gallium compound comprises alkyl gallium and the gallium treatment agent does not comprise oxygen.

17. The method of claim 15, comprising adding the sulfur treatment agent to the mixture, wherein the sulfur treatment agent comprises a trialkylsilyl sulfide compound.

18. A quantum dot comprising:
   zinc,
   selenium,
   tellurium, and
   sulfur
   and not comprising cadmium,
   wherein the quantum dot further comprises gallium and a primary amine having 5 or more carbon atoms,
   the quantum dot is configured to emit light having a maximum emission peak in a range of greater than or equal to about 453 nanometers and less than or equal to about 480 nanometers by excitation light, and
   in the quantum dot, a mole ratio of gallium to zinc is greater than or equal to about 0.1:1 and less than about 1:1.

19. The quantum dot of claim 18, wherein the quantum dot has a full width at half maximum of less than or equal to about 30 nanometers and a quantum efficiency of greater than or equal to about 80%.

20. The quantum dot of claim 18, wherein the primary amine comprises an alkenyl group having 10 or more carbon atoms.

21. The quantum dot of claim 18, wherein the quantum dot does not comprise a semiconductor nanocrystal of a Group III-V compound.

22. An electroluminescent device comprising
a first electrode and a second electrode facing each other; and
a quantum dot emission layer between the first electrode and the second electrode, the quantum dot emission layer comprising a plurality of quantum dots,
wherein the plurality of quantum dots comprise the quantum dot of claim 1.

23. A quantum dot, comprising:
a core comprising a first semiconductor nanocrystal comprising zinc, selenium, and tellurium;
a semiconductor nanocrystal shell on the core, the semiconductor nanocrystal shell comprising zinc and selenium; and
a ligand comprising gallium and a primary amine having 5 or more carbon atoms on a surface of the quantum dot,
wherein the quantum dot does not comprise cadmium,
the quantum dot is configured to emit light having a maximum emission peak in a range of greater than about 450 nanometers and less than or equal to about 480 nanometers by excitation light, and
the maximum emission peak has a full width at half maximum of less than about 33 nanometers.

* * * * *